United States Patent [19]
Smith et al.

[11] Patent Number: 5,964,031
[45] Date of Patent: Oct. 12, 1999

[54] METHOD FOR SUPPORTING PRINTED CIRCUIT BOARD ASSEMBLIES

[75] Inventors: Douglas K. Smith, Caldwell; Randal D. Lewis, Boise, both of Id.

[73] Assignee: MCMS, Inc., Nampa, Id.

[21] Appl. No.: 08/926,139

[22] Filed: Sep. 9, 1997

[51] Int. Cl.$^6$ ....................................................... H05K 3/30
[52] U.S. Cl. ............................... 29/832; 29/740; 29/741; 269/903
[58] Field of Search ............................. 29/740, 741, 760, 29/832, 840, 843, 281.1; 269/903

[56] References Cited

U.S. PATENT DOCUMENTS

| | | | |
|---|---|---|---|
| 4,850,104 | 7/1989 | Matrone et al. | 29/829 |
| 5,208,975 | 5/1993 | Hidese | 29/832 |
| 5,329,692 | 7/1994 | Kashiwagi | 29/740 |
| 5,682,675 | 11/1997 | Hirota | 29/840 |
| 5,711,065 | 1/1998 | Asai et al. | 29/740 |

*Primary Examiner*—Lee Young
*Assistant Examiner*—Bobby Rushing, Jr.
*Attorney, Agent, or Firm*—Seed and Berry, LLP

[57] ABSTRACT

A PCB support for supporting PCBs during surface mounting processing and other PCB assembly processes. In one embodiment, a PCB stand has a support structure attachable to an elevator table of a PCB processing machine and a platform connected to the support structure. The support structure may be a superstructure that can project away from the elevator table, and the platform may be a beam or other member that can support a significant portion of the surface area on the backside of the PCB. The superstructure and platform operate together to position the height of the platform with respect to the elevator table at an elevation at which the platform supports and interior region of the PCB assembly when the elevator table is in a processing position.

12 Claims, 8 Drawing Sheets

METHOD FOR SUPPORTING PRINTED CIRCUIT BOARD ASSEMBLIES

TECHNICAL FIELD

The present invention relates to manufacturing printed circuit board assemblies, and more specifically to supporting one side of a printed circuit board while components are surface mounted to the other side.

BACKGROUND OF THE INVENTION

Printed circuit board assemblies are used in computers, communications equipment, televisions and many other products. In a typical printed circuit board assembly, many electrical components are attached to the top and bottom surfaces of a printed circuit board (PCB). Since the electronics manufacturing industry is highly competitive, it is important to maximize the through-put and accuracy of attaching components to the PCBs.

Many PCB assemblies are manufactured by surface mounting components to the PCBs. For example, many Single In-line Memory Modules and Dual In-line Memory Modules have a plurality of memory dies or packaged memory devices surface mounted to a PCB. To surface mount components to one side of a PCB, a dispenser deposits solder pads and/or adhesive pads onto the PCB, and then a component placing machine presses the components against the solder and adhesive pads. After one side of the PCB has been populated with components, the PCB may be inverted and the process may be repeated to surface mount components to the other side of the PCB. The solder/adhesive dispensers are typically pen-type dispensers or stenciling machines, and the component placing machines are typically turret-type pick-and-place devices. After the components are mounted to the PCB, the populated PCB passes through a reflow oven to melt the solder paste and thus solder the components to the PCB.

Surface mounting components to PCBs raises several manufacturing issues that are best understood in light of conventional component placing machines or pen-type glue dispensers. Conventional component placing machines generally have a programmable component mounting head with a mechanism that places selected components at desired locations on a PCB. Conventional component placing machines may also have a PCB holder with edge clamps that engage the edges of a PCB, an elevator table under the PCB holder, and two spaced-apart conveyor tracks to transport the PCB along a conveyor line. In operation, the conveyor tracks transport the PCB until it is positioned at the PCB holder, and then the clamps engage the edges of the PCB. Once the PCB is securely held by the clamps, the mounting head places components at desired locations on the PCB.

To enhance the through-put of finished PCB assemblies, surface mounting processes must quickly and accurately attach large numbers of very small and/or complex components to the PCBs. The dispensing machines, for example, must accurately deposit very small solder pads and adhesive pads at precise locations on the PCB. Similarly, the component placing machines must accurately press the electrical components onto the pads at precise locations so that the electrical terminals of the components engage the desired solder pads. For proper placement of solder paste, adhesives and components onto a PCB, the PCB must remain flat as the dispensing and component placing machines exert forces against the PCB. Thus, it is desirable to support the underside of the PCB during processing to inhibit bowing, deflection or warping of the PCB.

To support the underside of PCBs, a plurality of single-pin board supports are attached to the elevator table of a processing machine to engage interior areas on the underside of a PCB assembly. Single-pin board supports typically have a bracket slidably attached to the elevator table and a pin threadedly engaged with a hole in the bracket. The pin is laterally positioned under a PCB by sliding the bracket across the elevator table, and the pin is vertically positioned by rotating it with respect to the bracket. Several types of PCB assemblies require twenty or more single-pin supports to adequately support the PCBs.

Conventional single-pin board supports, however, encounter several manufacturing issues when several small lots of different PCB assemblies are manufactured in a short period of time. Different PCB assemblies typically have different PCBs with different dimensions. The height and location of each single-pin support, therefore, must be adjusted each time a different lot of PCB assemblies is manufactured. However, it is extremely time-consuming to accurately adjust such a large number of pins to be at the desired height and location. Moreover, with some PCBs, there is not adequate space to install enough single-pin supports to properly support the PCB. Thus the set-up time to configure conventional PCB supports and the lack of flexibility in positioning such supports may significantly increase the cost of manufacturing small lots of PCB assemblies.

SUMMARY OF THE INVENTION

The present invention is a PCB support for supporting PCBs during surface mounting processing and other processes for manufacturing PCB assemblies. In one embodiment, the PCB support is a circuit board stand that has a support structure attachable to PCB processing machine and a platform connected to the support structure. The support structure may be adjustable along an adjustment axis transverse to a plane defined by a PCB held in the processing machine. Additionally, the support structure may be an adjustable superstructure projecting away from an elevator table of the processing machine. The platform may be an elongated support member attached to the superstructure, or the platform may be another member projecting from the superstructures transversely with respect to the adjustment axis. The superstructure may extend and contract to position the height of the platform with respect to the elevator table at an elevation at which the platform supports an interior region of the PCB assembly when the elevator table is in a processing position. Additionally, the platform may have a planar support surface that extends for the full length of the PCB so that the platform can support a significant portion of the interior region on the backside of the PCB.

In one embodiment, the support structure has first and second legs, and the platform is a beam with first and second ends. The first and second legs of the support structure project from the elevator table and are attached to the first and second ends of the beam, respectively. The first and second ends of the beam may be spaced apart from one another along a longitudinal axis of the beam by a distance approximately equal to the length of the PCB so that the beam spans across an area of the PCB that would otherwise be supported by several single-pin supports. To position the beam at the desired elevation to support the interior region of the PCB, the beam may be adjustable with respect to the first and second legs, or the first and second legs may be adjustable with respect to the elevator table. For example, the first and second legs may have upper ends attached to the beam and lower ends threadedly engaged with holes in the elevator table. The height of the beam with respect to the elevator table may accordingly be adjusted along the full length of the PCB solely by rotating the first and second legs in the threaded holes of the elevator table. In another example, the first and second legs may have lower ends attached to the elevator table and upper ends threadedly engaged with a threaded fastener attached to the beam. The height of the beam in this embodiment may thus be adjusted along the full length of the PCB solely by rotating either the legs or the fasteners.

In still another embodiment, the platform is laterally positionable with respect to the elevator table and the PCB to locate the platform under a desired portion the PCB. For example, the first and second legs of the support structure may have upper ends slidably positioned in first and second transverse channels along the bottom of the platform. The platform may then be translated with respect to the first and second legs to laterally position the platform with respect to the PCB assembly. In another example, the first and second legs may be mounted to first and second connectors that are slidably attached to the elevator table. The platform may be positioned laterally by sliding the connectors on the elevator table. Additionally, the first and second legs may be threadedly engaged with holes in the first and second connectors so that the height of the first and second legs may be adjusted by rotating the legs within the holes.

DETAILED DESCRIPTION OF THE INVENTION

The present invention is an apparatus and method for supporting printed circuit boards in the manufacturing of printed circuit board assemblies. It will be appreciated that specific details of certain embodiments of the invention are set forth in the following description in FIGS. 1–8 to provide a person skilled in the art with a thorough understanding of how to make and use these embodiments of the present invention. One skilled in the art, however, will understand that the present invention may have additional embodiments that may be practiced without these details.

Figure 1:
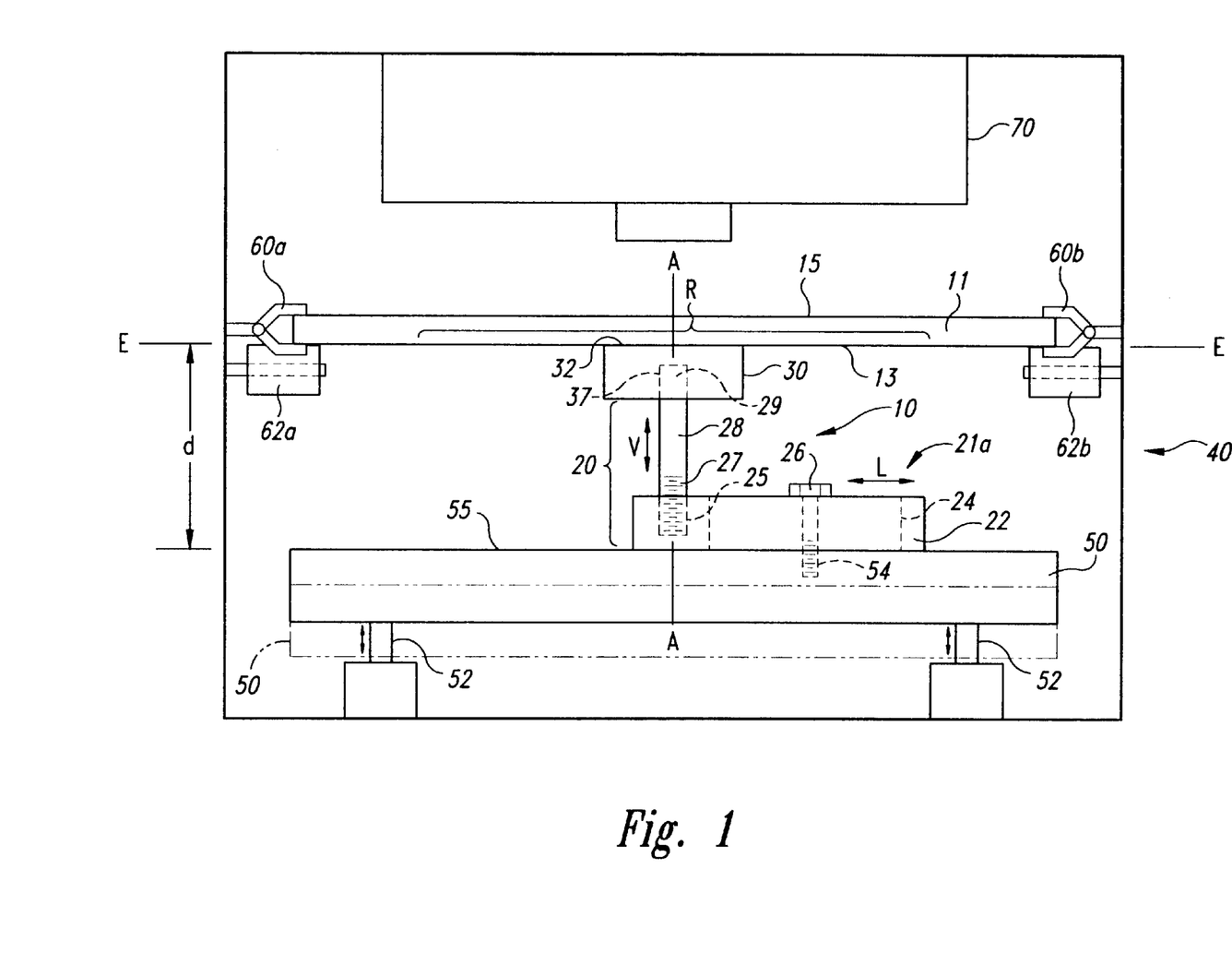
FIG. 1 is a side elevational view of a circuit board stand in a processing machine in accordance with an embodiment of the invention.
Figure 2:
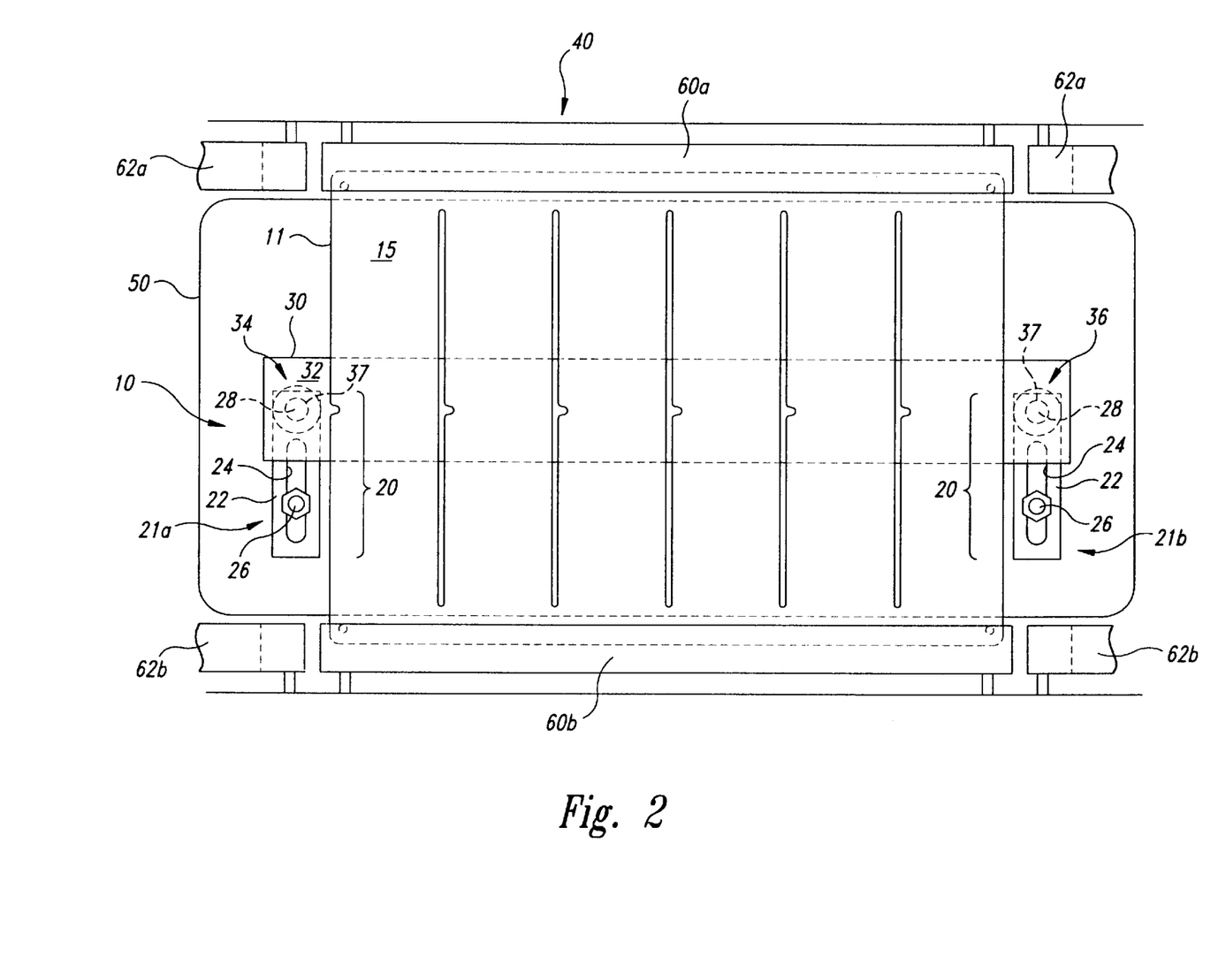
FIG. 2 is a top plan view of the circuit board stand of FIG. 1.

FIG. 1 is a side elevational view and FIG. 2 is a top plan view of one embodiment of a PCB stand 10 supporting a PCB 11 in a PCB processing machine 40. The PCB stand 10 may have a support structure 20 and a platform 30 attached to the support structure 20 to project transversely with respect to an adjustment axes A—A (only on shown in FIG. 1) of the support structure 20. As described below, the PCB stand 10 may be adjustable to position a support surface 32 of the platform 30 at an elevation E—E (FIG. 1) to support an interior region R (FIG. 1) of the PCB 11 during processing.

In the embodiment of the PCB stand 10 shown in FIGS. 1 and 2, the support structure 20 has first and second adjustable superstructures 21a and 21b (FIG. 2) attached respectively to first and second ends 34 and 36 of the platform 30. The first and second superstructures 21a and 21b have identical components, and thus only the components of the first superstructure 21a are described with the understanding that like components of the second superstructure 21b are identified by like reference numbers. The first superstructure 21a has a connector 22 slidably attached to an elevator table 50 of the PCB processing machine 40. The connector 22 may have a slot 24 and a fastener 26 received in the slot 24 to threadedly engage a hole 54 in the elevator table 50. The support structure 20 shown in FIGS. 1 and 2 may provide lateral positioning of the platform 30 by loosening the fasteners 26 and sliding the connectors 22 of the first and second superstructures 21a and 21b in a direction L until the support surface 32 of the platform 30 is positioned under a desired portion of the interior region R of the PCB 11. The fasteners 26 are then tightened to prevent lateral movement of the connectors 22. Also, as best shown in FIG. 1, the first and second superstructures 21a and 21b each have a leg 28 with a lower end 25 threadedly engaged with a hole 27 in the connector 22 and an upper end 29 positioned in a hole 37 in the platform 30. Thus, the support structure 20 also provides vertical positioning of the platform 30 by rotating the legs 28 of the first and second superstructures 21a and 21b to vertically displace the platform 30 along line V.

The PCB stand 10 may be used in component placing machines, stencil printing machines, pen-type paste dispensers, reflow ovens and other PCB assembly processing machines. For example, the PCB processing machine 40 shown in FIGS. 1 and 2 may be a component placing that has a PCB holder with first and second clamps 60a and 60b, a conveyor system with first and second conveyor rails 62a and 62b, and a component mounting head 70 positioned above the clamps 60a and 60b over the elevator table 50. The elevator table 50 is mounted to actuators 52 that move the elevator between a lowered position (shown in phantom lines in FIG. 1) and a raised or processing position (shown in solid lines in FIG. 1). Before the PCB 11 is positioned under the head 70, an operator adjusts the first and second superstructures 21a and 21b so that the support surface 32 of the platform 30 is spaced apart from a top surface 55 of the elevator table 50 by a distance "d" (FIG. 1) equal to the distance between the elevation E—E and the top surface 55 when the elevator table 50 is in the processing position. The conveyor rails 62a and 62b then carry the PCB 11 to a workstation underneath the component mounting head 70, and the clamps 60a and 60b engage the edges of the PCB 11. At this point, the actuators 52 lift the elevator table 50 to the processing position so that the support surface 32 of the platform 30 supports a portion of the interior region R at the backside 13 of the PCB 11. It will be appreciated, therefore, that the support surface 32 inhibits deflection or warping of the PCB 11 during processing to enhance the accuracy with which the component mounting head 70 places components on the front side 15 of the PCB 11.

Figure 3:
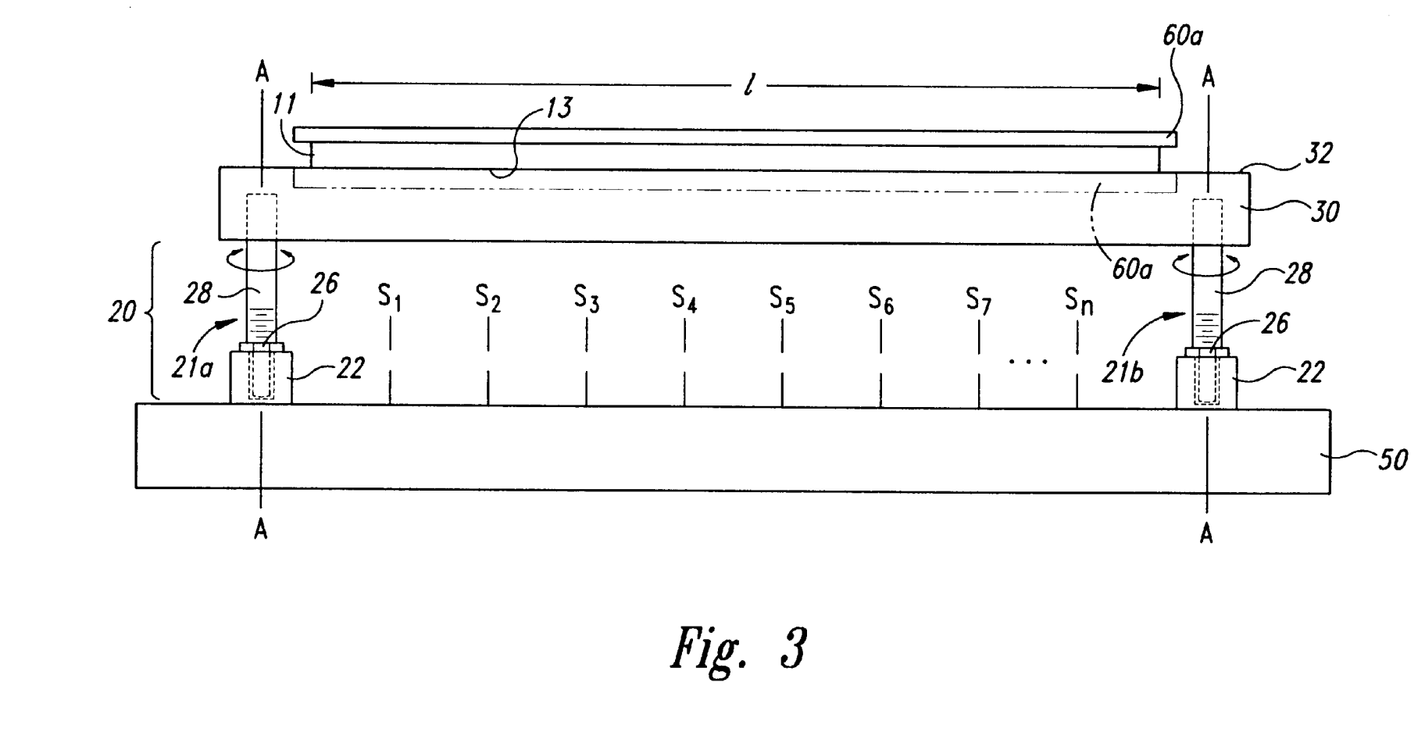
FIG. 3 is a front elevational view of the circuit board stand of FIGS. 1 and 2.

The embodiment of the PCB stand 10 illustrated in FIGS. 1 and 2 significantly reduces the set-up time to configure a PCB processing machine to surface mount components to a PCB. FIG. 3 is a partial front elevational view illustrating some of the advantages of the PCB stand 10 compared to conventional single-pin supports. In conventional systems, a plurality of individual single-pin supports (not shown) similar to the superstructures 21a and 21b are positioned at a plurality of sites $S_1$–$S_n$ under the PCB 11. Since all of the single-pin supports must be individually set at exactly the same height to engage the backside 13 of the PCB 11, it is extremely time-consuming to accurately configure the single-pin supports. For example, in applications that require 15–25 single-pin supports, it can take up to two hours to properly set up the support pins to adequately support the interior region of a different PCB for processing a new run of PCB assemblies. The PCB stand 10 reduces the set-up time by providing a platform 30 that spans across the pin sites $S_1$–$S_n$ of conventional pin supports so that the platform 30 may be positioned to support a different PCB by adjusting just the first and second superstructures 21a and 21b. The PCB stand 10 can usually be set-up to support a different run of PCB assemblies in about five minutes. Thus, the PCB stand 10 is particularly useful in contract PCB assembly manufacturing because it greatly reduces the down-time associated with setting up PCB assembly lines to manufacture runs of different PCB assemblies.

The embodiment of the PCB stand 10 illustrated in FIGS. 1 and 2 also provides better support of the PCB 11 compared to conventional single-pin board supports. Referring to FIG. 2, the support surface 32 of the platform 30 uniformly supports a significant portion of the interior region R at the backside 13 of the PCB 11. Conventional single-pin supports, however, only support a few, small surface points of a PCB. Moreover, because it is so difficult to position all of the conventional single-pin supports at the exact same height, one or more of the single-pin supports typically acts as a fulcrum about which the PCB 11 pivots during processing. The embodiment of the PCB stand 10 shown in FIGS. 1 and 2, however, reduces pivoting of the PCB 11 because the support surface 32 of the platform 30 is a planar surface that uniformly supports the backside 13 of the PCB 11.

Figure 4:
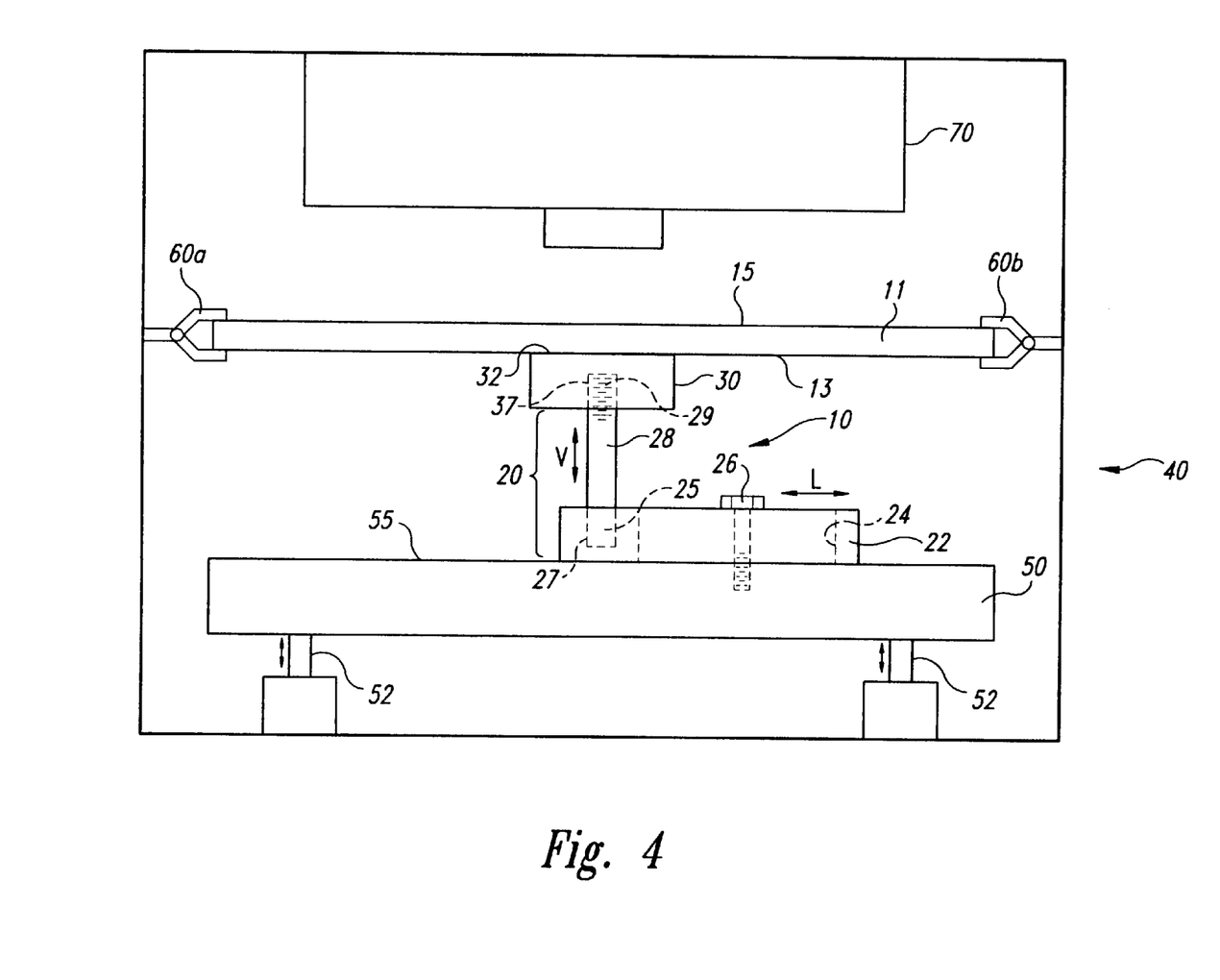
FIG. 4 is a side elevational view of another circuit board stand in a processing machine in accordance with another embodiment of the invention.

FIG. 4 is a side elevational view of another embodiment of a PCB stand 10 in which the legs 28 (only one shown) of the support structure 20 each have a lower end 25 positioned in the hole 27 of the connector 22 and an upper end 29 threadedly engaged with the hole 37 in the platform 30. The remaining components of the PCB stand 10 are the same as those described above with respect to FIGS. 1 and 2. To adjust the height of the platform 30, the legs 28 are rotated to move the platform 30 to a desired elevation. In this embodiment, therefore, the support platform 30 moves relative to the legs 28 to adjust the height of the support platform 30. In still another embodiment (not shown), the holes 37 are housed in rotatable fasteners attached to the platform 30 so that the height of the platform 30 relative to the legs 28 may be changed by rotating the rotatable fastener. Accordingly, the advantages of the support stand 10 shown in FIG. 4 are substantially the same as described above with respect to FIGS. 1–3.

Figure 5:
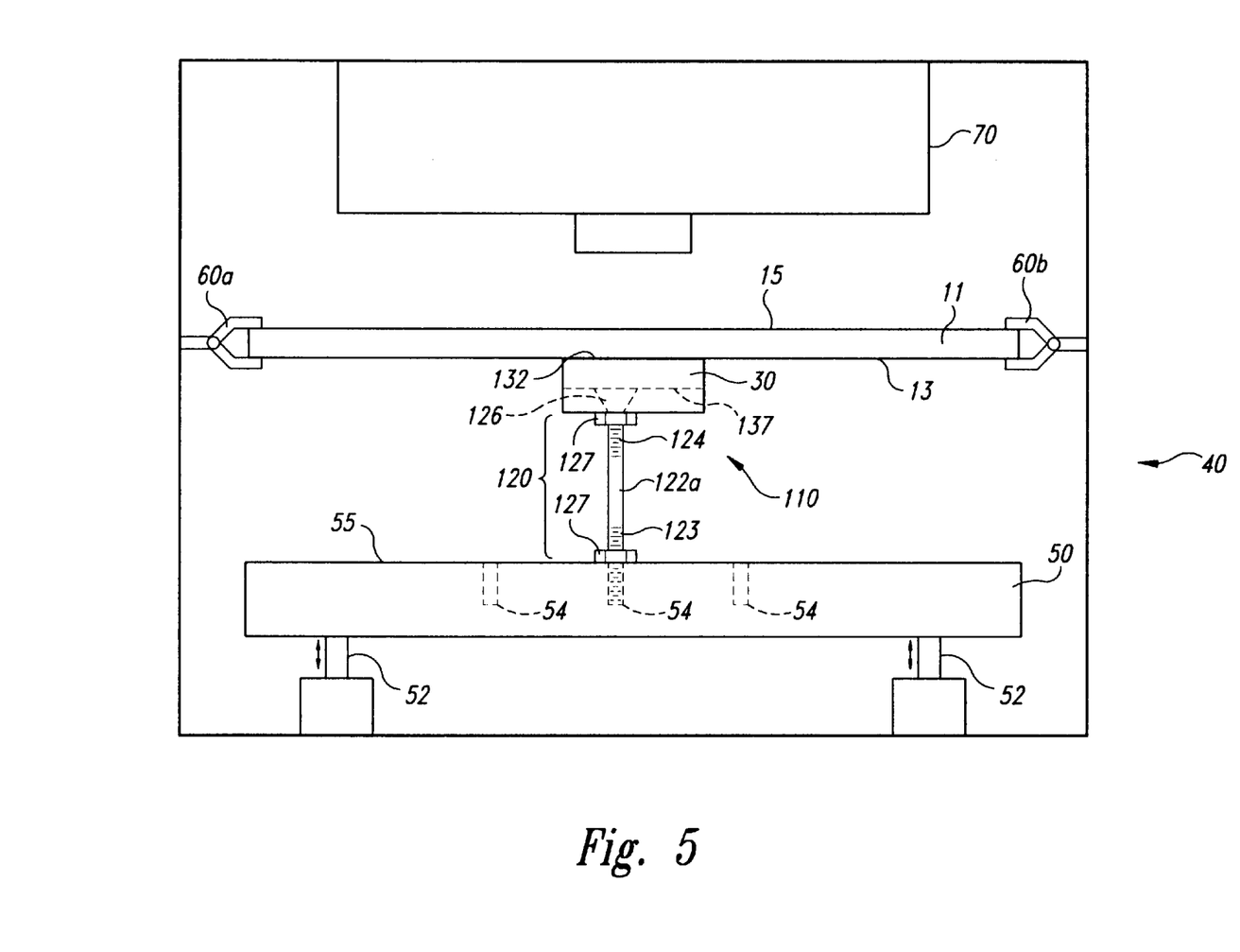
FIG. 5 is a side elevational view of still another circuit board stand in a processing machine in accordance with still another embodiment of the invention.
Figure 6:
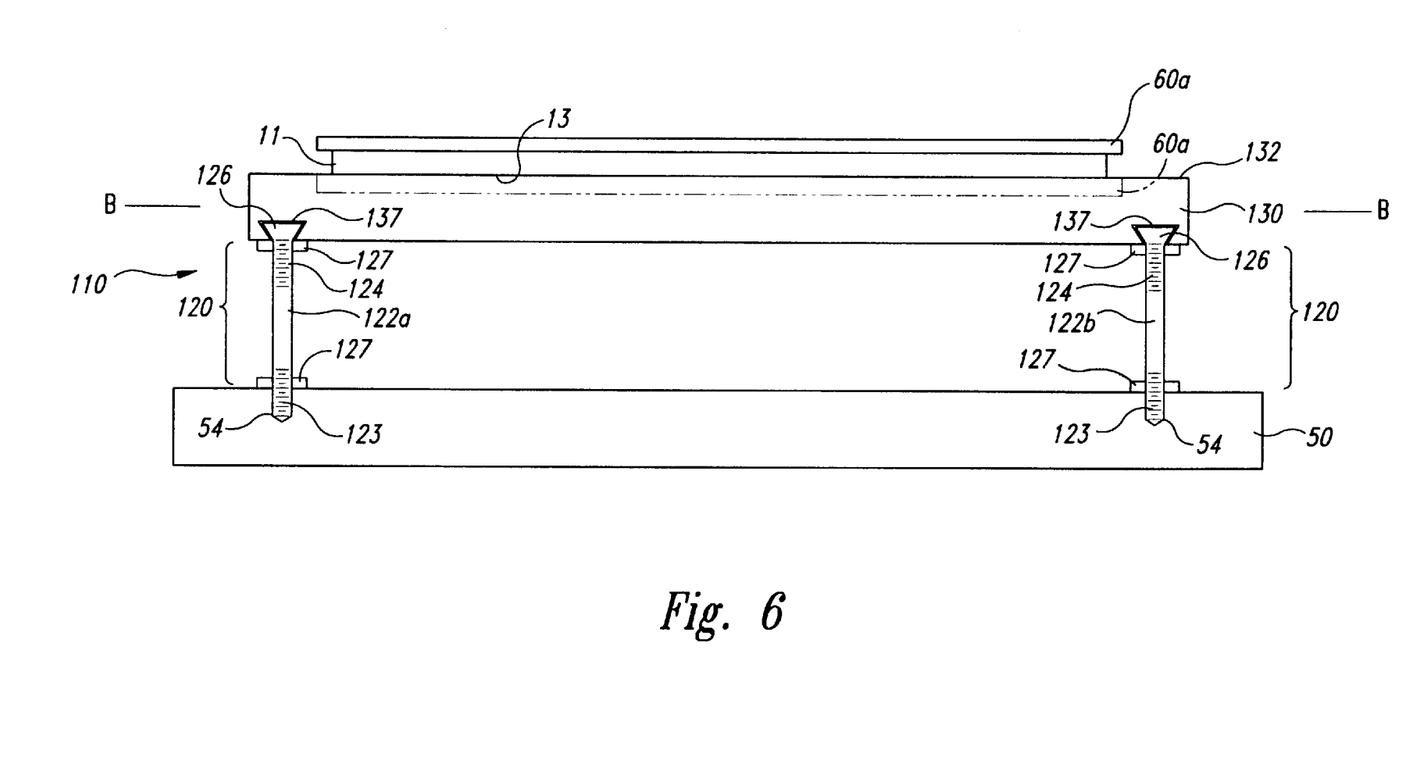
FIG. 6 is a front elevational view of the circuit board stand of FIG. 5.

FIG. 5 is a side elevational view and FIG. 6 is a front elevational view of another embodiment of a PCB stand 110 for supporting the PCB 11 during processing. The PCB stand 110 has a support structure 120 that carries a platform or beam 130 to position a support surface 132 of the platform 130 at a desired height with respect to the elevator table 50.

The support structure 120 may have first and second legs 122a and 122b attached to the elevator table 50 and the support platform 130. In one embodiment, each of the first and second legs 122a and 122b has a lower end 123 threadedly engaged in a hole 54 of the elevator table 50 and an upper end 124 with a head 126 positioned in a transverse channel 137 along the bottom side of the support platform 130. The upper end 124 of each leg 122a and 122b may be threaded, and thus a lock nut 127 may be positioned at the lower and upper ends 123 and 124 of the legs 122a and 122b. The channels 137 extend transversely with respect to a longitudinal axis B—B (FIG. 6) of the support platform 130 to slidably receive the heads 126 of the first and second legs 122a and 122b. In operation, the height of the support platform 130 is adjusted by loosening the lock nuts 127 at the lower ends 123 of the legs 122a and 122b, and then rotating the legs 122a and 122b to a desired position. Similarly, to adjust the lateral position of the support platform 130, the lock nuts 127 at the upper ends 124 of the legs 122a and 122b are loosened, and then the support platform 130 is translated so that the heads 126 of the legs 122a and 122b slide within the channels 137. The lock nuts 127 are then tightened to hold the support platform 130 at the desired height and lateral position.

Figure 7:
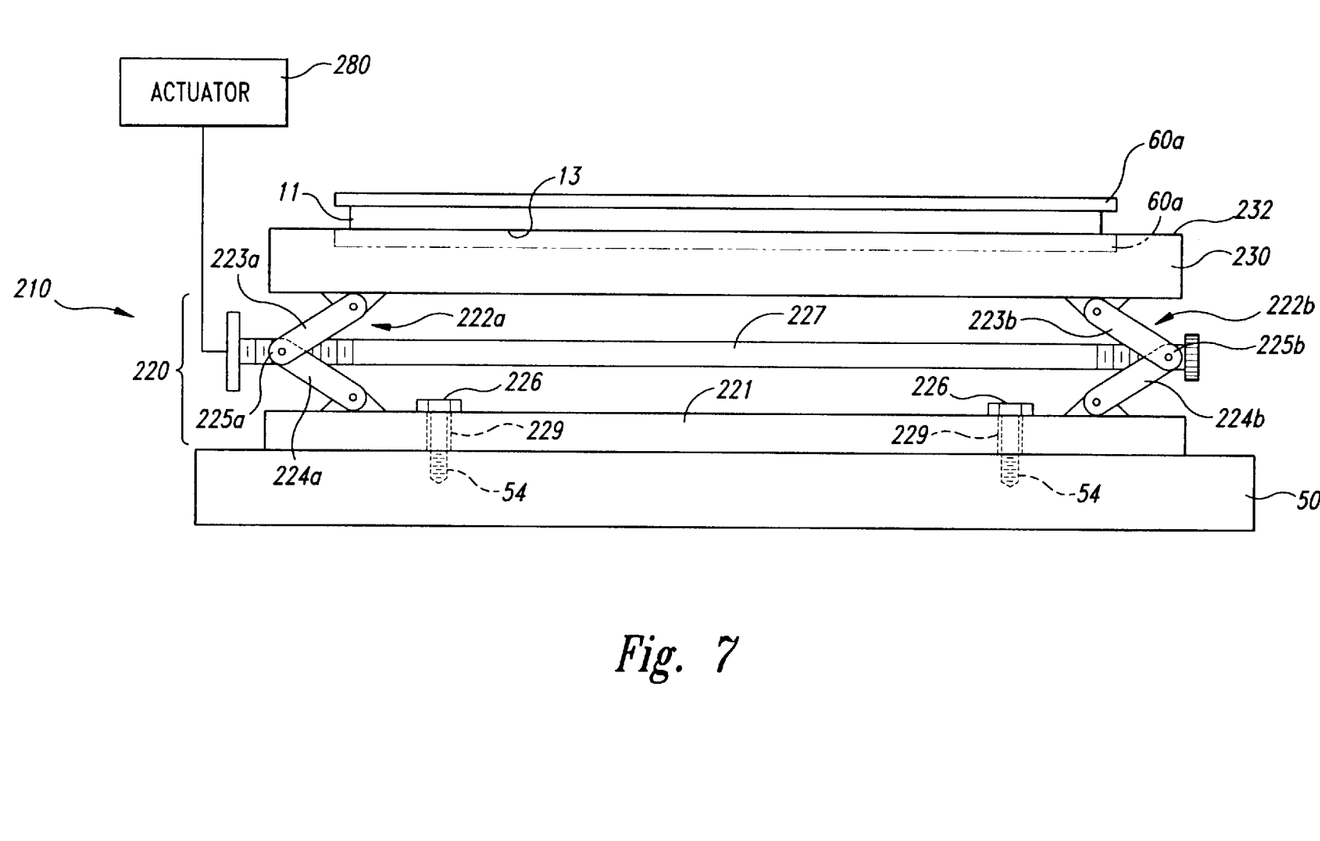
FIG. 7 is a front elevational view of yet another circuit board stand in a processing machine in accordance with yet another embodiment of the invention.
Figure 8:
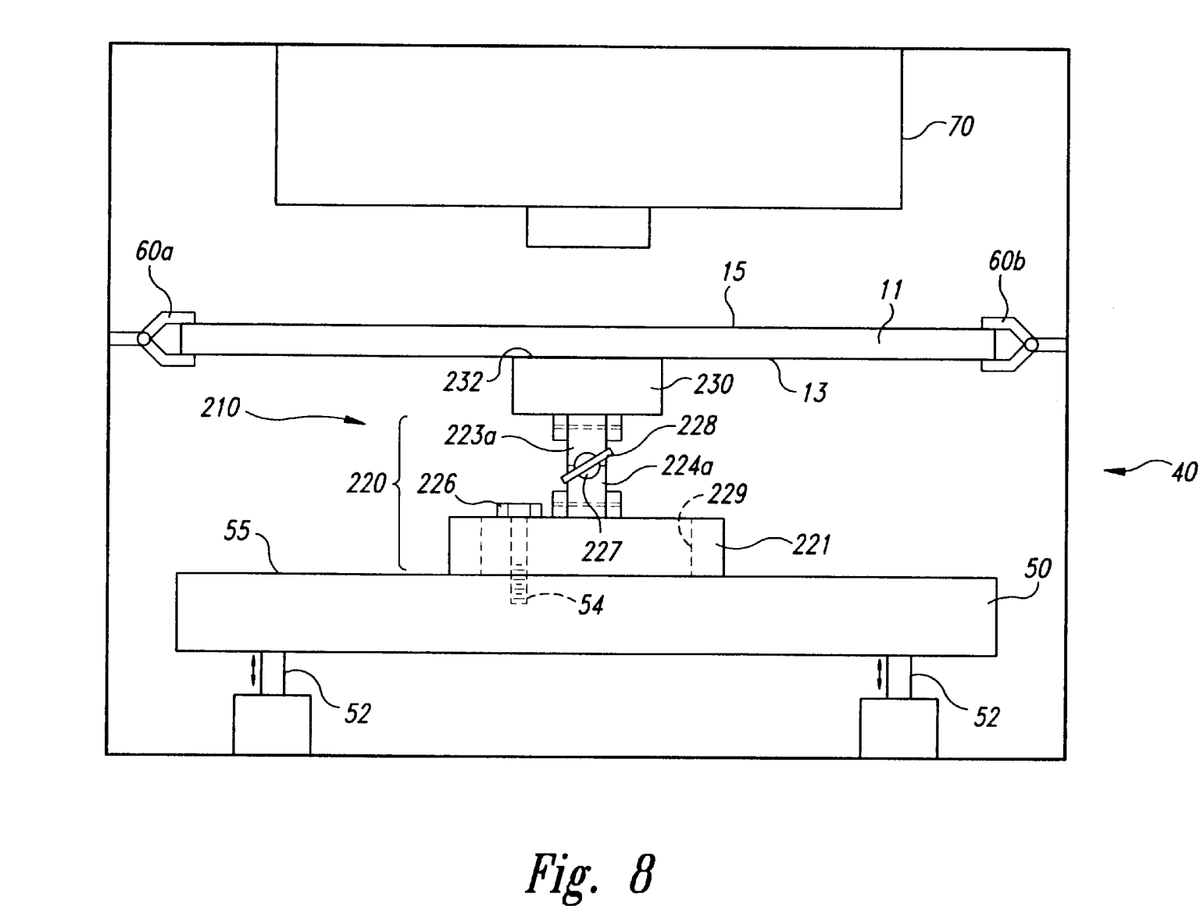
FIG. 8 is a side elevational view of the circuit board stand of FIG. 7.

FIG. 7 is a front elevational view and FIG. 8 is a side elevational view of still another PCB stand 210 for supporting the PCB 11 in a PCB processing machine. The PCB stand 210 may have a support structure 220 with a base 221, a first leg 222a, and a second leg 222b. The first and second legs 222a and 222b may be toggle joints operated by a single threaded member 227. In this embodiment, the first leg 222a has an upper link 223a attached to one end of the support platform 230 and a lower link 224a attached to the base 221. The upper and lower links 223a and 224a are pivotally attached together at a knee 225a with threads that engage the threaded member 227. The second leg 222b has first and second links 223b and 224b similar to the first and second links 223a and 224a of the first leg 222a. To adjust the height of the support platform 230 with respect to the elevator table 50, the threaded member 227 is rotated to simultaneously extend or contract the first and second legs 222a and 222b until the support platform 230 is at a desired elevation. Additionally, to laterally position the PCB stand 210, a number of fasteners 226 (best shown in FIG. 8) are loosened and the base 221 is translated along the elevator table so that the fasteners 226 slide within corresponding slots 229 (best shown in FIG. 8) in the base 221. The embodiment of the PCB stand 210 illustrated in FIGS. 7 and 8 operates to provide substantially the same advantages as the PCB stands 10 and 110 described above.

From the foregoing it will be appreciated that, although specific embodiments of the invention have been described herein for purposes of illustration, various modifications may be made without deviating from the spirit and scope of the invention. For example, in addition to being used with component placing processing machines, the PCB stands may also be used with other PCB assembly machines. For example, a pen-type dispensing machine substitutes a pen dispenser for the component head 70 to deposit solder paste or adhesive pads onto the front side 15 of the PCB 11. In most pen-type dispensing machines, the edges of the PCB 11 are held by clamps, and thus a PCB may be supported by the PCB stands. Accordingly, the PCB stands are applicable to virtually any PCB processing machine, and especially to those in which the edges of the PCB are held in clamps. Additionally, the PCB stands may be attached to a fixed base or another fixed component of the processing machine, and only the support structure moves the platform up and down to support the PCB. The legs of the support structure, for example, may be coupled to servo-motors or other actuators that selectively move the legs to position the platform at the desired elevation. The PCB stand 210 in FIGS. 7 and 8 is particularly well suited for this application because an actuator 280 (FIG. 7) may be coupled to the threaded member 227 to selectively position the platform 230 at a desired elevation. The invention, therefore, is not limited except as by the appended claims.

We claim:

1. A method of placing components onto a printed circuit board in surface mounting processing of printed circuit board assemblies, comprising:

holding edges of the printed circuit board under a component placing head of component placing machine;

positioning a support surface of a platform apart from an elevator table of the component placing machine by a distance substantially equal to a gap distance between the elevator table and a backside of the printed circuit board when the elevator table is raised into a processing position, wherein a first leg is attached to a first end of the platform and a second leg is attached to a second end of the platform, the first and second legs being threadedly engaged with holes in the elevator table, and wherein positioning the platform comprises changing the height of the first and second legs with respect to the elevator table by rotating the first and second legs with respect to the elevator table;

moving the elevator table into the processing position; and pressing components onto a front side of the printed circuit board with the component placing head, the support surface of the platform inhibiting deflection of the interior region as the components are pressed against the printed circuit board.

2. A method of placing components onto a printed circuit board in surface mounting processing of printed circuit board assemblies, comprising:

holding edges of the printed circuit board under a component placing head of component placing machine;

positioning a support surface of a platform apart from an elevator table of the component placing machine by a distance substantially equal to a gap distance between the elevator table and a backside of the printed circuit board when the elevator table is raised into a processing position, wherein a first leg is attached to a first end of the platform and a second leg is attached to a second end of the platform, the first and second legs being threadedly engaged with holes in a first connector and a second connector, respectively, and wherein positioning the platform comprises changing the height of the first and second legs with respect to the elevator table by rotating the first and second legs with respect to the first and second connectors;

moving the elevator table into the processing position; and pressing components onto a front side of the printed circuit board with the component placing head, the support surface of the platform inhibiting deflection of the interior region as the components are pressed against the printed circuit board.

3. The method of claim 2 wherein the first and second connectors are slidably attached to the elevator table, and wherein the method further comprises laterally positioning the first and second connectors on the elevator table to laterally position the platform under a desired portion of the interior region of the printed circuit board.

4. A method of placing components onto a printed circuit board in surface mounting processing of printed circuit board assemblies, comprising:

holding edges of the printed circuit board under a component placing head of component placing machine;

positioning a support surface of a platform apart from an elevator table of the component placing machine by a distance substantially equal to a gap distance between the elevator table and a backside of the printed circuit board when the elevator table is raised into a processing position, wherein a first leg is attached to a first end of the platform and a second leg is attached to a second end of the platform, and wherein positioning the platform comprises changing the height of the platform with respect to the first and second legs;

moving the elevator table into the processing position; and pressing components onto a front side of the printed circuit board with the component placing head, the support surface of the platform inhibiting deflection of the interior region as the components are pressed against the printed circuit board.

5. The method of claim 4 wherein the first and second legs are threadedly engaged with holes in the platform, and wherein changing the height of the platform comprises rotating the first and second legs with respect to the holes in the platform.

6. A method of placing components onto a printed circuit board in surface mounting processing of printed circuit board assemblies, comprising:

holding edges of the printed circuit board under a component placing head of component placing machine;

positioning a support surface of a platform apart from an elevator table of the component placing machine by a distance substantially equal to a gap distance between the elevator table and a backside of the printed circuit board when the elevator table is raised into a processing position, wherein a first toggle joint is attached to a first end of the platform, a second toggle joint is attached to a second end of the platform, and a threaded member is attached to the first and second toggle joints to cause the first and second toggle joints to extend and contract in unison corresponding to rotation of the threaded member, and wherein positioning the platform comprises rotating the threaded member;

moving the elevator table into the processing position; and pressing components onto a front side of the printed circuit board with the component placing head, the support surface of the platform inhibiting deflection of the interior region as the components are pressed against the printed circuit board.

7. A method of depositing a material onto a printed circuit board in surface mounting processing of printed circuit board assemblies, comprising:

holding edges of the printed circuit board under a dispenser head of a material dispensing machine;

positioning a support surface of a platform apart from an elevator table of the material dispensing machine by a distance substantially equal to a gap distance between the elevator table and a backside of the printed circuit board when the elevator table is raised into a processing position, wherein a first leg is attached to a first end of the platform and a second leg is attached to a second end of the platform, the first and second legs being threadedly engaged with holes in the elevator table, and wherein changing the height of the first and second legs comprises rotating the first and second legs with respect to the elevator table;

moving the elevator table into the processing position; and depositing the material onto a front side of the printed circuit board with the dispenser head of the dispensing machine, the support surface of the platform inhibiting deflection of the interior region as the material is deposited onto the printed circuit board.

8. A method of depositing a material onto a printed circuit board in surface mounting processing of printed circuit board assemblies, comprising:

holding edges of the printed circuit board under a dispenser head of a material dispensing machine;

positioning a support surface of a platform apart from an elevator table of the material dispensing machine by a distance substantially equal to a gap distance between the elevator table and a backside of the printed circuit board when the elevator table is raised into a processing position, wherein a first leg is attached to a first end of the platform and a second leg is attached to a second end of the platform, the first and second legs being threadedly engaged with a first connector and a second connector, respectively, and wherein changing the height of the first and second legs comprises rotating the first and second legs with respect to the first and second connectors;

moving the elevator table into the processing position; and depositing the material onto a front side of the printed circuit board with the dispenser head of the dispensing machine, the support surface of the platform inhibiting deflection of the interior region as the material is deposited onto the printed circuit board.

9. The method of claim 8 wherein the first and second connectors are slidably attached to the elevator table, and wherein the method further comprises laterally positioning the first and second connectors on the elevator table to laterally position the platform under a desired portion of the interior region of the printed circuit board.

10. A method of depositing a material onto a printed circuit board in surface mounting processing of printed circuit board assemblies, comprising:

holding edges of the printed circuit board under a dispenser head of a material dispensing machine;

positioning a support surface of a platform apart from an elevator table of the material dispensing machine by a distance substantially equal to a gap distance between the elevator table and a backside of the printed circuit board when the elevator table is raised into a processing position, wherein a first leg is attached to a first end of the platform and a second leg is attached to a second end of the platform, and wherein positioning the platform comprises changing the height of the platform with respect to the first and second legs;

moving the elevator table into the processing position; and depositing the material onto a front side of the printed circuit board with the dispenser head of the dispensing machine the support surface of the platform inhibiting deflection of the interior region as the material is deposited onto the printed circuit board.

11. The method of claim 10 wherein the first and second legs are threadedly engaged with holes in the platform, and wherein changing the height of the platform comprises rotating the first and second legs with respect to the holes in the platform.

12. A method of depositing a material onto a printed circuit board in surface mounting processing of printed circuit board assemblies, comprising:

holding edges of the printed circuit board under a dispenser head of a material dispensing machine;

positioning a support surface of a platform apart from an elevator table of the material dispensing machine by a distance substantially equal to a gap distance between the elevator table and a backside of the printed circuit board when the elevator table is raised into a processing position, wherein a first toggle joint is attached to a first end of the platform, a second toggle joint is attached to a second end of the platform, and a threaded member is attached to the first and second toggle joints to cause the first and second toggle joints to extend and contract in unison corresponding to rotation of the threaded member, and wherein positioning the platform comprises rotating the threaded member;

moving the elevator table into the processing position; and depositing the material onto a front side of the printed circuit board with the dispenser head of the dispensing machine, the support surface of the platform inhibiting deflection of the interior region as the material is deposited onto the printed circuit board.

* * * * *